United States Patent
Ben Artsi et al.

(10) Patent No.: US 12,471,205 B1
(45) Date of Patent: Nov. 11, 2025

(54) CONTROLLING UNIFORMITY OF ELECTRICAL CURRENT DISTRIBUTION IN DEVICE FOR POWER DELIVERY TO INTEGRATED CIRCUIT

(71) Applicant: Marvell Israel (M.I.S.L) Ltd., Yokneam (IL)

(72) Inventors: Liav Ben Artsi, Nahariya (IL); Ram Ben Ezra, Yokneam Illit (IL)

(73) Assignee: Marvell Asia Pte Ltd, Singapore (SG)

( * ) Notice: Subject to any disclaimer, the term of this patent is extended or adjusted under 35 U.S.C. 154(b) by 216 days.

(21) Appl. No.: 18/350,775

(22) Filed: Jul. 12, 2023

Related U.S. Application Data

(60) Provisional application No. 63/388,273, filed on Jul. 12, 2022.

(51) Int. Cl.
  *H05K 1/02* (2006.01)
  *H05K 1/11* (2006.01)
  *H05K 3/40* (2006.01)

(52) U.S. Cl.
  CPC .......... *H05K 1/0218* (2013.01); *H05K 1/115* (2013.01); *H05K 3/4038* (2013.01); *H05K 2201/10734* (2013.01)

(58) Field of Classification Search
  CPC ...... H05K 1/115; H05K 1/116; H05K 1/0224; H05K 1/0225; H05K 1/0218; H05K 3/4038; H05K 2201/10734; H05K 2201/093
  See application file for complete search history.

(56) References Cited

U.S. PATENT DOCUMENTS

| | | | | |
|---|---|---|---|---|
| 6,521,842 | B2 * | 2/2003 | Brinthaupt, III | H05K 1/0201 174/266 |
| 2007/0075431 | A1 * | 4/2007 | Miyazaki | H05K 1/0263 257/773 |
| 2018/0184514 | A1 * | 6/2018 | Yamada | H05K 1/0265 |

OTHER PUBLICATIONS

Azeroual et al., U.S. Appl. No. 18/179,406, filed Mar. 7, 2023.
Ben Artsi et al., U.S. Appl. No. 17/700,556, filed Mar. 3, 2022.

\* cited by examiner

*Primary Examiner* — Roshn K Varghese
(74) *Attorney, Agent, or Firm* — Meitar Patents Ltd.; Daniel Kligler

(57) ABSTRACT

An electrical circuit board assembly includes: (I) a surface, having a plurality of terminals disposed thereon for transferring a power signal to an electronic device, (II) at least first and second layers separated by at least one dielectric layer, the first and second layers being configured to (a) be connected to the power signal, and (b) electrically conduct at least a portion of the power signal, and (III) multiple vias that (i) mechanically traverse the first and second layers at respective traversal points, and (ii) are electrically connected to the terminals on the surface, the multiple vias including: first vias that, at the respective traversal points, are electrically connected to the first layer and electrically isolated from the second layer, and second vias that, at the respective traversal points, are electrically connected to the second layer and electrically isolated from the first layer.

19 Claims, 4 Drawing Sheets

CONTROLLING UNIFORMITY OF ELECTRICAL CURRENT DISTRIBUTION IN DEVICE FOR POWER DELIVERY TO INTEGRATED CIRCUIT

CROSS-REFERENCE TO RELATED APPLICATIONS

This application claims the benefit of U.S. Provisional Patent Application 63/388,273, filed Jul. 12, 2022, whose disclosure is incorporated herein by reference.

FIELD OF THE DISCLOSURE

The present invention relates generally to electronic devices, and particularly to methods and systems for controlling the uniformity of power supply across an electronic device.

BACKGROUND

Various techniques for supplying electrical power to components of an electronic device are known in the art. Typically the supply of electrical current suffers from uneven distribution of the electrical current, resulting in the formation of hotspots which receive current density higher than a predefined threshold, and cold spots where the current supplied is less than another predefined threshold.

The description above is presented as a general overview of related art in this field and should not be construed as an admission that any of the information it contains constitutes prior art against the present patent application.

SUMMARY

An embodiment of the present invention that is described herein provides an electrical circuit board assembly including: (I) a surface, having a plurality of terminals disposed thereon for transferring a power signal to an electronic device, (II) at least first and second layers separated by at least one dielectric layer, the first and second layers being configured to (a) be connected to the power signal, and (b) electrically conduct at least a portion of the power signal, and (III) multiple vias that (i) mechanically traverse the first and second layers at respective traversal points, and (ii) are electrically connected to the terminals on the surface, the multiple vias including: first vias that, at the respective traversal points, are electrically connected to the first layer and electrically isolated from the second layer, and second vias that, at the respective traversal points, are electrically connected to the second layer and electrically isolated from the first layer.

In some embodiments, the vias are portioned into the first vias and the second vias to maintain a differential in electrical-current density of the power signal between the first vias and the second vias at a level less than a predetermined threshold. In other embodiments, a partitioning of the vias into the first vias and the second vias reduces, below a predetermined threshold, a difference in an electrical-current density of the power signal between the first layer and the second layer. In yet other embodiments, the vias are portioned into the first vias and the second vias to maintain a differential in electrical-current density of the power signal among the multiple terminals at a level less than a predetermined threshold.

In some embodiments, the vias are portioned into the first vias and the second vias to maintain a differential in electrical-current density of the power signal flowing within a predefined area of at least one of the first layer and the second layer, at a level less than a predetermined threshold. In other embodiments, the first vias are arranged in a first region, and the second vias are arranged in a second region, and a difference in current density among ones of vias and terminals in a first region and current density among corresponding ones of vias and terminals in a second region is less than a predetermined threshold.

In some embodiments, the first and second regions do not overlap with one another. In other embodiments, the first and second regions at least partially overlap with one another. In yet other embodiments, the first and second regions being arranged in concentric shapes.

In some embodiments, the electrical circuit board assembly further includes third vias that, at the respective traversal points, are electrically connected to both the first layer and the second layer, and the difference in current density among the first vias, the second vias and the third vias is less than a predetermined threshold. In other embodiments, one or more of the third vias are arranged in at least one of the first region and the second region. In yet other embodiments, at least one of the: (i) first vias, (ii) second vias, and (iii) third vias is arranged outside of both the first region and the second region.

In some embodiments, the electrical circuit board assembly further includes a power supply unit (PSU) configured to generate the power signal. In other embodiments, the power signal includes an electrical current of power flowing from the PSU to the electronic device. In yet other embodiments, the power signal includes an electrical current of ground flowing from the electronic device to the PSU.

There is additionally provided, in accordance with an embodiment of the present invention, a method for fabricating an electrical circuit board assembly, the method includes fabricating at least first and second circuit board layers separated by at least one dielectric layer, the first and second circuit board layers being connected to a power signal for electrically conducting at least a portion of the power signal. Multiple vias are formed in the circuit board layers, the multiple vias (i) mechanically traverse the first and second layers at respective traversal points, and (ii) are electrically connected to an outer surface of the substrate assembly that is facing an electronic device. The formation of the multiple vias includes formation of first vias that, at the respective traversal points, are electrically connected to the first layer and electrically isolated from the second layer, and formation of first vias that, at the respective traversal points, are electrically connected to the second layer and electrically isolated from the first layer.

The present disclosure will be more fully understood from the following detailed description of the embodiments thereof, taken together with the drawings in which:

DETAILED DESCRIPTION OF EMBODIMENTS

Figure 1:
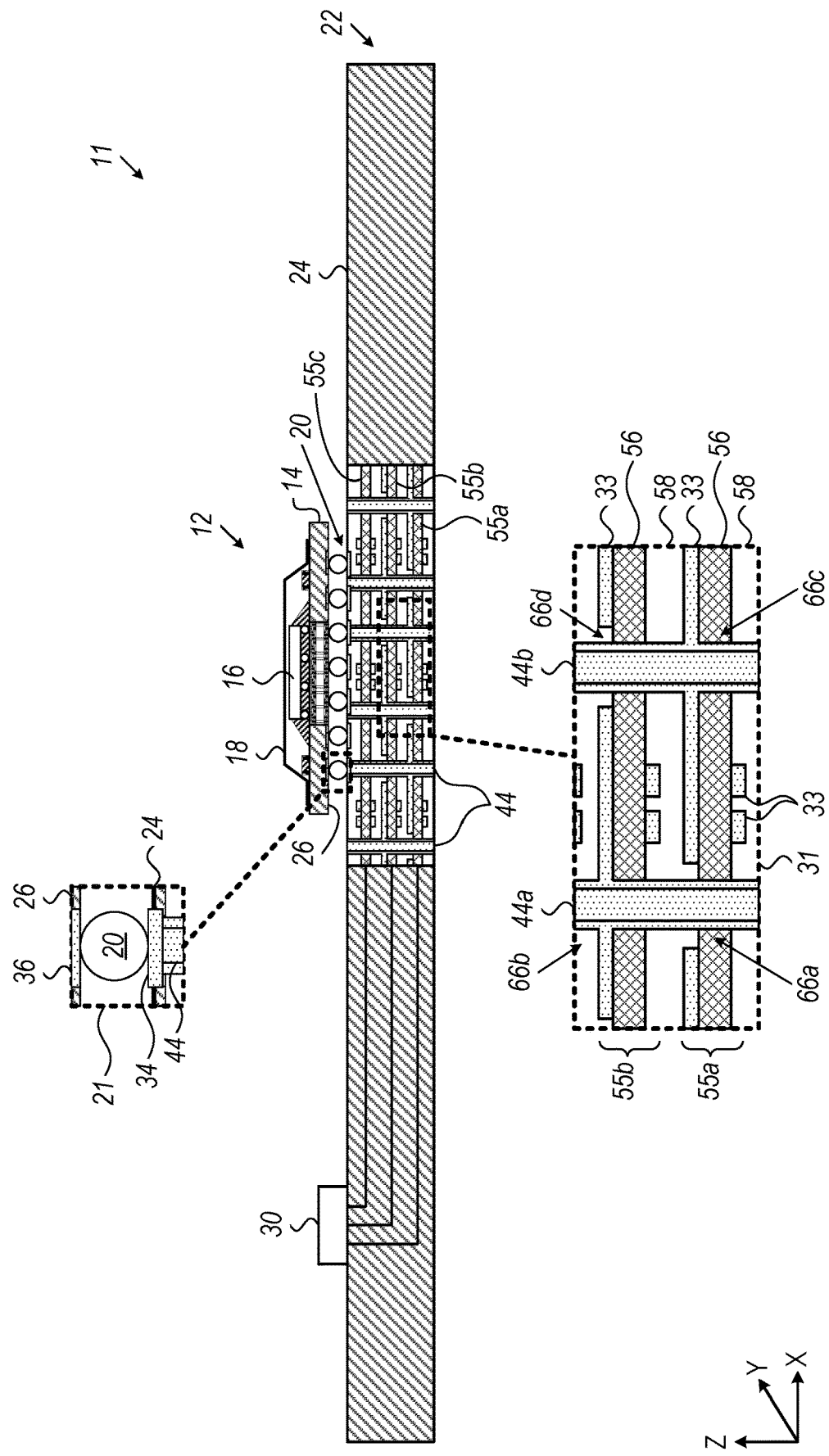
FIG. 1 is a schematic, sectional view of an electronic device, in accordance with an embodiment that is described herein.

Electronic devices, such as Integrated Circuit (IC) dies implemented in network communication devices, processors, or memory storage devices, are typically mounted on a substrate, such as a circuit board (CB). While being operated, the IC dies typically receive power from a power supply unit (PSU) coupled to the CB. The electrical current of the power is typically conducted from the PSU to a selected IC die, via power channels and ground channels implemented in layers of the CB.

In some cases, the IC die comprises a network switch implemented in an application specific integrated circuit (ASIC). The ASIC is incapsulated in a package, and may consume high power, e.g., over 100 s of watts (W) during steady state operation. It is noted that the electrical current of the power supply flows, through the CB and the package of the switch, in a path of least resistance. As such, the distribution of current is typically non-uniform across the CB and the package, i.e., the power delivery system, thus resulting in non-uniform current density. The non-uniformity in current density may increase the voltage drops over specific sections of a power delivery system in the electronic device, and thereby, may reduce the electrical performance of the electronic device. Moreover, the non-uniformity in current density may increase the temperature at specific regions of the electronic device, which can also negatively impact performance or lead to premature degradation of the device. The specific regions having high current density, e.g., higher than a predefined value of threshold, and in some cases also high temperatures, are referred to herein as hotspots, which reduce the electrical performance and may result in failures of such electronic devices.

Embodiments that are described herein provide novel layouts for improving the uniformity of current flowing through electronic devices, and thereby, reducing the current hot spots and overheating of high-power electronic devices. In some embodiments, an electronic device comprises a package of an Integrated Circuit (IC) die, and a power supply unit (PSU), both mounted on a circuit board (CB). The CB comprises a stack of: (i) at least first layers and second layers comprising metal traces, typically made from copper, configured to conduct the electrical current of a specific power (e.g., about 1.2 V) from the PSU to the package, and (ii) at least one dielectric layer disposed between the first and second layers for electrically isolating between the first and second layers. The outer surface of the uppermost (e.g., first) layer (or the lowermost layer, e.g., the second layer) of the CB is: (i) facing at least the package of the IC die, and (ii) has a plurality of terminals (e.g., pads and solder balls) disposed thereon for conducting the electrical current of the power from the PSU, via the CB, to the package of the IC die. It is noted that other layers of the CB, may be allocated for conducting power signals having another level of power, e.g., 1.3 V or 1.5 V. Typically, such layers are electrically isolated from the first and second layers described above.

In some embodiments, the CB comprises multiple vias that mechanically traverse (i) the dielectric layer, and (ii) the first and second layers at respective traversal points. It is noted that conventionally all a specific power (e.g., the the vias delivering aforementioned 1.2 V) are electrically connected to the terminals on the surface of the first layer and/or the second layer (depending on the configuration of the electronic device). Conventionally vias that are designated for supplying a given voltage are coupled to all of the power layers for that voltage, but are disconnected from power layers for the other voltages. For example, on conventional CBs the vias allocated for conducting the 1.2 V power are electrically coupled to all layers conducting the 1.2 V power but are isolated from the CB layers allocated to conduct other levels of power (e.g., 1.3 V).

In some embodiments, the vias comprise: (i) first vias that, at the respective traversal points, are electrically connected to the first layer and electrically isolated from the second layer, the first and second layers are both designated for power supply at the same attribute, e.g., the same voltage, (ii) second vias that, at the respective traversal points, are electrically connected to the second layer and electrically isolated from the first layer providing power with the same attribute, and optionally, (iii) third vias electrically connected to both the first and second layers. It is noted that the partitioning of the vias into the first vias, second vias, and third vias, each of which group of vias is selectively coupled to one or more layers supplying electrical power having a same power attribute, such as voltage, and selective isolated from one or more other layer supplying power having the same attribute improves the control and uniformity of the electrical current flowing through several components of the electronic device. In other words, the electrical connection and electrical isolation between the vias and the first and second layers comprises any suitable mix of the first vias, second vias, and third vias that delivers the required level of flux and uniformity of the electrical current. For example, (i) the first vias may be arranged in a first region, and the second vias may be arranged in a second region, or (ii) the first vias and the second vias are arranged in the same region (first region and/or second region), or any other suitable arrangement. In some embodiments, the first and second regions do not overlap with one another, but in other embodiments, at least a portion of the first and second regions overlap with one another.

As such, the electronic device is configured to control the partitioning of electrical current flow between different predetermined regions of respective layers, and between vias that are electrically connected to the respective predetermined regions. In other words, the vias are portioned into first vias, second vias, and optionally third vias, to maintain a differential in electrical-current density of the power signal between the first vias and the second vias (and optionally the third vias) at a level less than a predetermined threshold. Moreover, the vias are portioned into first vias, second vias, and optionally third vias, to maintain a differential in electrical-current density of the power signal between other components of the electronic device, such as between terminals (e.g., pads and balls), power layers, and selected areas in the power layers. It is noted that based on the disclosed techniques, the electronic device is configured to control the uniformity of the electrical current flowing across: (i) the layers and vias of the CB, (ii) the terminals disposed on the surface of the CB, and (iii) the package of the IC die. Moreover, controlling the uniformity of the electrical current reduces the number and intensity of the hotspots, and thereby, configures the resistivity of each region and improves the electrical performance of the electronic device.

The description above is presented as a general overview of embodiments of the present disclosure, which are described in detail herein.

FIG. 1 is a schematic, sectional view of an electronic device 11, in accordance with an embodiment that is described herein.

In some embodiments, electronic device 11 comprises an integrated circuit (IC) die 16, in the present example, a network switch implemented in an application specific integrated circuit (ASIC). IC die 16 is encapsulated in a package 12, e.g., a Flip-chip ball grid array (FC-BGA) package. Package 12 is mounted on a substrate assembly, in the present example, an electrical circuit board referred to herein as a circuit board (CB) 22. It is noted that typically multiple packages of IC dies are mounted on CB 22, so that FIG. 1 presents a section of CB 22, for the sake of presentation clarity.

In some embodiments, package 12 comprises a package substrate 14, and a lid 18 (or alternatively without lid 18). IC die 16 is mounted on package substrate 14 and lid 18 encapsulates or surrounds at least part of IC die 16. Moreover, package substrate 14 is mounted on a surface 24 of CB 22, and a plurality of terminals, such as balls 20 (e.g., solder balls) of a ball grid array (BGA), are disposed between package substrate 14 and surface 24 for conducting various types of signals (e.g., power signals and data signals) between package 12 and CB 22, as will be described below. In the context of the present disclosure and in the claims, the term "terminals" refers to a general term that comprises at least one of pads, pins, balls, springs, and other suitable types of physical and electrical connections between blocks of electronic device 11, and between electronic device 11 and a substrate, such as package substrate 14 and/or CB 22.

In some embodiments, electronic device 11 comprises a power supply unit (PSU) 30, which is configured to supply electrical power to package 12 via CB 22. In the present example, PSU 30 is mounted on surface 24 of CB 22 besides package 12. In one implementation, PSU 30 may be electrically connected to an external power supply (not shown) for transferring the power to CB 22. In other embodiments, PSU 30 may be disposed at any other suitable position of electronic device 11.

In the present example, electronic device 11 is depicted within a three-dimensional (3D) XYZ coordinate system. It is noted that (i) the region of CB 22 located below package 12 along a Z-axis is shown in a sectional view, and (ii) the other regions of CB 22 are shown in a uniform texture for the sake of presentation clarity.

Reference is now made to an inset 31 showing a sectional view of the structure of a part of CB 22. In some embodiments, each layer 55 comprises one or more traces 33 (typically made from copper or from any other suitable electrically conductive material), which are formed within or over the outer surface of a polymer-based sublayer 56.

Figure 2:
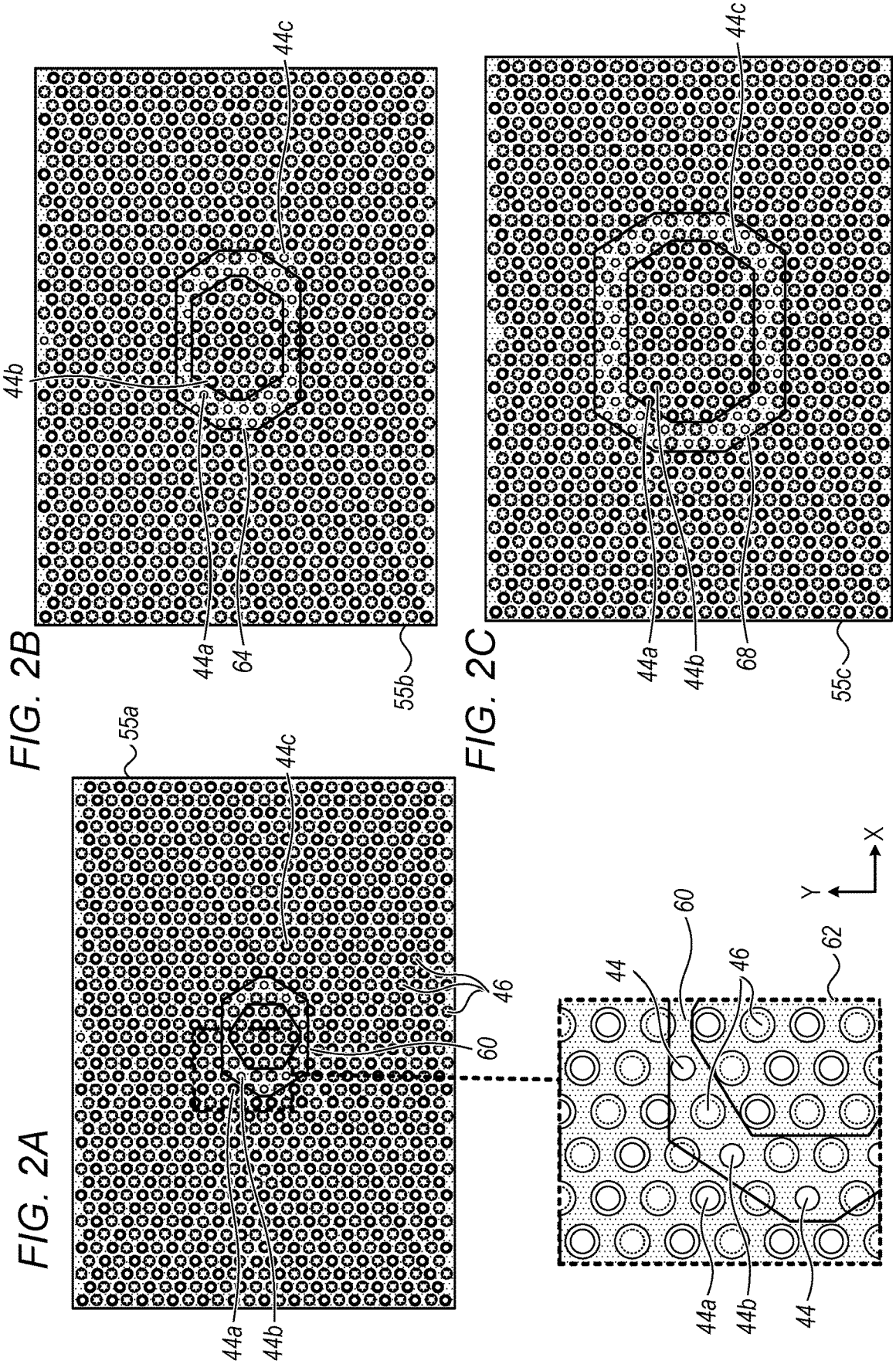
FIGS. 2A, 2B, and 2C are schematic top views of traversing vias, and anti-pads implemented in layers of a substrate assembly of the electronic device of FIG. 1, in accordance with embodiments that are described herein.

In some embodiments, CB 22 comprises multiple layers 55, such as layers 55a and 55b shown in inset 31, and vias configured to conduct several types of signals to and from package 12. In the example of FIG. 1, the vias comprise power vias 44 configured to conduct electrical power, as will be described in detail below, but CB 22 typically comprises additional types of vias, such as ground vias shown in FIG. 2 below, and vias for conducting data signals. The vias of CB 22 are typically made from copper (or from any other suitable electrically conductive material). Moreover, CB 22 comprises one or more dielectric layers 58 formed between layers 55. Dielectric layers 58 are configured to electrically isolate between conductive components, such as vias 44 and traces 33 of layers 55.

In some embodiments, CB 22 may comprise a stack of about thirty-six (36) layers 55, or any other suitable number of layers 55. In the present example, about twelve (12) of layers 55 are configured to conduct data signals, about other twelve (12) layers are configured to be reference to the electromagnetic wave propagating through these layers, e.g., between IC die 16 and another IC die (not shown) mounted on CB 22. In this example configuration, the remaining 12 layers are configured to conduct power and ground signals leaving six (6) layers 55 of the stack that are configured to conduct a specific power signal rail. In the context of the present disclosure and in the claims, the term "power signal" refers to electrical power conducted from PSU 30 to package 12, via power channels and ground channels implemented in layers 55 and the vias, as will be described below. More specifically, PSU 30 drives electrical current via the power channels to package 12, and receives electrical current from package 12 via the ground channels. The power channels comprise power vias 44, and the ground channels comprise ground vias shown in FIG. 2A below. Power vias 44 are also referred to herein as vias 44, for brevity.

In some embodiments, the electrical current flows from PSU 30 to IC die 16 (i) over several layers 55 and vias 44 of the power channels of CB 22, (ii) through balls 20, and (iii) through a pattern of layers, vias and bumps (all not shown) of package substrate 14. Similarly, electrical current of the ground flows from package 12 to PSU 30, via the ground channels implemented by allocating in package substrate 14 and CB 22: (i) layers 55, other than that of the power channels, (ii) ground vias, and (iii) bumps and balls 20 assigned for conducting the electrical current of the ground. In the present example, layers 55 and vias 44 of inset 31 serve in the power channels.

In some cases, the structure of at least one of IC die 16 and package substrate 14, may cause a non-uniform distribution of the electrical current flowing from PSU 30 to IC die 16. The non-uniform flow of the electrical current may result in undesired phenomena, such as (i) hotspots of excess electrical current density generated at specific regions of CB 22 and/or package 12, as well as (ii) excess heat and excess voltage drop generated at the specific regions due to the excess electrical current density.

The sectional view of FIG. 1 presents power channels, and therefore, only the components of the power channels (e.g., power vias 44, and layers 55 assigned for the power channels) are depicted. It is noted that the same embodiments (with necessary changes) are applicable to the ground channels and all the components thereof. In some embodiments, vias 44 traverse through layers 55 at traversal points 66. In the example of inset 31, a via 44a traverses through layers 55a and 55b at traversal points 66a and 66b, respectively. Moreover, a via 44b traverses through layers 55a and 55b at traversal points 66c and 66d, respectively.

In some embodiments, traces 33 are configured to be electrically connected to the power signal described above. Moreover, traces 33 are configured to connect between vias 44 and layers 55 at traversal points 66. In the example of inset 31, (i) at traversal point 66a, traces 33 of layer 55a are electrically isolated from via 44a, and (ii) at traversal point 66b, traces 33 are electrically coupled to via 44a. As such, layer 55b and via 44a are electrically connected to one another. In this configuration, layer 55b and via 44a are both electrically connected to the power signal received from PSU 30. In some embodiments, CB 22 is configured to have two or more power planes, such as layers 55a-55c, carrying power of a same attribute, such as voltage, that is different from an attribute of power supplied through on or more other power planes of CB 22, which are configured to supply power having a different attribute. In such embodiments, at least some of the vias 44 are selectively coupled to one or more of the power planes having the same attribute without being coupled to all of the planes having the same attribute.

In some embodiments, when via 44b is configured to traverse layers 55a and 55b: (i) at traversal point 66d, traces 33 of layer 55b are electrically isolated from via 44b, and (ii) at traversal point 66c, traces 33 are electrically coupled to via 44b, such that layer 55a and via 44b are electrically connected to one another. In this configuration, layer 55a and via 44b are both electrically connected to the power signal received from PSU 30.

Reference is now made to an inset 21 showing the interface between package substrate 14 and CB 22. In some embodiments, ball 20 electrically couples between a pad 34 of CB 22, and a pad 36 of package substrate 14, so as to conduct the signals, e.g., the power signals described above. Pad 34 is formed over surface 24 of CB 22, and pad 36 is formed on a surface 26 of package substrate 14. Both pads 34 and 36 typically comprise traces of copper, or any other suitable electrically conductive material, for conducting the signals between package 12 and CB 22 via ball 20. It is noted that the term ball is not meant to limit other means of electrically coupling package 12 and CB 22 such as springs or the like.

Reference is now made back to the general view of FIG. 1. In the context of the present disclosure and in the claims, the term "anti-pad" refers to the electrical isolation between vias 44 and traces 33, as shown for example in traversal points 66a and 66d of inset 31. In some embodiments, the current density of the power signal is controlled by implementing anti-pads at predefined locations within CB 22. In other words, the electrical isolation between a via 44 and a layer 55 at the traversal point increases the electrical resistance of the respective layer 55. It is noted that anti-pads may be implemented in both power channels and ground channels. In such embodiments, the disclosed architecture of CB 22 is configured to control the uniformity of the current density supplied from PSU 30 to IC die 16: (i) among vias 44, layers 55 (also referred to herein as power layers), and pads 34 of CB 22, (ii) among balls 20, (iii) among pads 36 on surface 26, and among the structures (e.g., traces and vias) of package substrate 14, and (iv) across the terminals (not shown) of IC die 16.

Moreover, the disclosed architecture of CB 22 is configured to control the uniformity of the current density of the ground current received by PSU 30 over the ground channels (e.g., layers 55 assigned to conduct the electrical power of ground). In other words, the disclosed techniques reduce the number and the severity of hotspots in electronic device 11. It is noted that the uniformity of the electrical current flowing across CB 22 is achieved by selectively controlling the number of power planes (e.g., layers 55) supplying power (or ground) having the same electrical attribute to which a given via is coupled.

Moreover, the disclosed architecture of CB 22 is configured to control the uniformity of the current density of the electrical current power supplied by PSU 30 over the power channels (e.g., layers 55 designated to conduct the electrical current of the power). In other words, by applying selective electrical connection and/or electrical isolation between selected vias (e.g., vias 44) and power planes (e.g., layers 55), the disclosed techniques reduce the number and the severity of hotspots and/or cold spots in electronic device 11.

FIGS. 2A, 2B, and 2C are schematic top views of vias 44 and 46, and anti-pads implemented in layers 55a, 55b, and 55c, respectively, in accordance with embodiments that are described herein.

Reference is now made to FIG. 2A. In some embodiments, layer 55a comprises: (i) power vias 44, configured to conduct electrical current of the power from PSU 30 to package 12 along the Z-axis, and (ii) ground vias 46, configured to conduct electrical current of the ground from package 12 to PSU 30 (and/or to a connection to an external ground), in a direction opposite to that of the electrical current of the power.

In some embodiments, layer 55a has a region 60 in which all power vias 44 in region 60 are electrically coupled to layer 55a, as shown for example in traversal point 66c of FIG. 1 above. It is noted that in the embodiment depicted all the other traversing vias that are not in region 60 are electrically isolated from layer 55a, e.g., using the anti-pad technique of traversal point 66a depicted in FIG. 1 above, or using any other suitable electrical isolation technique. More specifically, in the embodiment depicted, (i) all ground vias 46 traversing layer 55a, and (ii) all power vias 44 outside of region 60, are electrically isolated from layer 55a.

In some embodiments, region 60 has a ring shape as shown in FIG. 2A, and the other regions in layers 55b and 55c (depicted in detail in FIGS. 2B and 2C below), are also shaped as rings having different sizes. In the present example, (i) power via 44b is located within region 60 and is electrically coupled with layer 55a (e.g., at traversal point 66c shown in the sectional view of FIG. 1 above), and (ii) power vias 44a and 44c are located out of region 60 and are electrically isolated from layer 55a (e.g., power via 44a is shown at traversal point 66a in the sectional view of FIG. 1 above).

In other embodiments, power vias 44 that are electrically coupled to layer 55a may be arranged in a region having any other suitable shape (e.g., in any suitable shape of a circle or a polygon). Additionally, or alternatively, at least one of the power vias 44 that is electrically coupled to layer 55a, may be at least partially surrounded by vias 44 and/or vias 46 that are electrically isolated from layer 55a. In other words, at least some of the (i) electrically connected vias, and (ii) electrically isolated vias traversing layer 55a may be interleaved. Moreover, vias 44 electrically connected to a first power plane (e.g., layer 55a) may be selectively coupled to a second power plane (e.g., layer 55b) that supplies power having the same electrical attribute to that of layer 55a, regardless of whether a given via 44 is coupled to or isolated from layer 55b. In the present example, the connection and isolation between a given via and layer 55a is determined by the pattern of traces 33, and therefore, the arrangement of electrically connected and electrically isolated vias is simple to implement and can be rapidly carried out during the fabrication of CB 22. As such, a given via may be selectively coupled to one or more power planes supplying power having the same electrical attributes such as voltage.

Reference is now made to an inset 62 showing a section of layer 55a comprising a section of region 60. In some embodiments, power via 44b and all power vias 44 located within region 60 are electrically coupled to layer 55a. Moreover, layer 55a is assigned to the power channel, and therefore, (i) all ground vias 46 are electrically isolated from layer 55a, and (ii) power vias 44a, 44c, and all power vias 44 that are located out of region 60, are also electrically isolated from layer 55a.

It is noted that in this configuration, the electrical current flowing from PSU 30 to package 12 is distributed in layer 55a only within region 60. In other words, the disclosed techniques enable tight control of the current density of the power within layer 55a, and selected power vias 44. Moreover, it is noted that CB 22 may comprise any suitable number of power planes (e.g., layers 55). At least some of layers 55 are conducting electrical current having the same electrical attribute, such as voltage, in conjunction with power vias 44 that are selective coupled to one or more of the power layers 55 in which first vias (e.g., via 44b) are coupled to the first layer (e.g., layer 55a) and not to the second layer (e.g., layer 55b), second vias (e.g., via 44a) are coupled to the second layer (e.g., layer 55b) but not to the first layer (e.g., layer 55a), and third vias (e.g., via 44c) are coupled to both the second layer and the third layer, as will be depicted in detail in FIGS. 2B and 2C below. In other words, there may be more than two power layers and the power vias may be selectively coupled to one or more layers among all of the power layers.

Reference is now made to FIG. 2B. In some embodiments, layer 55b has a region 64 in which all power vias 44 are electrically coupled to layer 55b, as shown for example in traversal point 66b of FIG. 1 above. Moreover, in the present example, power via 44c that is traversing layer 55b out of region 64, is also electrically connected to layer 55b. It is noted that all the other traversing vias are electrically isolated from layer 55b, e.g., using the anti-pad technique of traversal point 66d depicted in FIG. 1 above, or using any other suitable electrical isolation technique. More specifically, (i) all ground vias 46 traversing layer 55b, and (ii) some of power vias 44 out of region 64 (e.g., power via 44b), are electrically isolated from layer 55b. Moreover, it is noted that (i) power via 44b is electrically isolated from layer 55b, while being electrically connected to layer 55a, and (ii) power via 44a is electrically connected to layer 55b, while being electrically isolated from layer 55a.

In some embodiments, region 64 has a ring shape, which surrounds the ring of region 60 of FIG. 2A above. In the present example, regions 60 and 64 do not have common vias.

In alternative embodiments, regions 60 and 64 may have any other suitable shapes. As such, regions 60 and 64 may not have any overlap, or alternatively, regions 60 and 64 may have at least some overlap with one another. It is noted that the shape of regions 60 and 64, and the level of overlap, are defined in order to control, in each of layers 55 of CB 22: (i) the level of electrical resistance, and (ii) the distribution of electrical-current density across an XY plain the of CB 22 (in the XYZ coordinate system described above). It is also noted that the shape of regions 60 and 64, and the level of overlap, are defined in order to control the distribution of the current through the vias connected to regions 60 and 64.

In some embodiments, before fabricating CB 22, a designer of CB 22 may apply a simulation software to a model of the layout of CB 22. The simulation software is configured to show the flow of the electrical-current in each layer 55 during the operation of electronic device 11. In case the simulation results that show a hotspot (i.e., an area having excess flow of electrical power), the designer may apply an anti-pad to electrically isolate one or more vias (e.g., vias 44 or 46) in the respective area, so as to remove or reduce the level of the hotspot. Similarly, in case the simulation results show a cold spot (i.e., an area having insufficient flow of electrical power), the designer may electrically connect one or more vias (e.g., vias 44 or 46 in the respective area) and at least one layer 55, so as to remove or reduce the level of the cold spot. For example, using a different layer to supply power, or using multiple layers to supply power.

Reference is now made to FIG. 2C. In some embodiments, layer 55b has a region 68 in which all power vias 44 are electrically coupled to layer 55c. It is noted that all the other traversing vias are electrically isolated from layer 55c, e.g., using the anti-pad technique depicted in FIG. 1 above. More specifically, (i) all ground vias 46 traversing layer 55c, and (ii) all power vias 44 out of region 68 (e.g., vias 44a and 44b), are electrically isolated from layer 55c. Moreover, it is noted that (i) power vias 44a and 44b are electrically isolated from layer 55c, while being electrically connected to layers 55a and 55b, respectively, and (ii) power via 44c is electrically connected to both layers 55b and 55c, while being electrically isolated from layer 55a.

In some embodiments, region 68 has a ring shape, which surrounds the rings of regions 60 and 64 of FIGS. 2A and 2B above, respectively. In the present example, regions 60, 64 and 68 comprise concentric rings. Moreover, the areas defined in regions 60, 64, and 68 do not overlap with one another. In other words, no power vias 44 or ground vias 46 are located in two or more of regions 60, 64 and 68.

In such embodiments, the electrical current flowing from PSU 30 to package 12 is partitioned between and distributed within regions 60, 64 and 68 of layers 55a, 55b and 55c, respectively. It is noted that the partitioning of vias 44 among regions 60, 64 and 68 improves the uniformity of the electrical current flowing through several components of electronic device 11. In one implementation, the density of electrical current flowing through each section within regions 60, 64 and 68 may be simulated prior to the design of CB 22, and by applying the disclosed techniques, the difference in the current density between any pair of regions among regions 60, 64 and 68, is set to be smaller than a predetermined threshold.

Thus, by applying premanufacturing design the disclosed techniques enable tight control of the current density of the power flowing: (i) within layers 55a, 55b and 55c, and (ii) through selected power vias 44 located within regions 60, 64 and 68, respectively. Moreover, the selected vias 44 conduct the electrical current to selected balls 20 and pads 34 and 36, so that based on the disclosed techniques, the flux of electrical current flowing through each ball 20 (and respective pads 34 and 36) is controlled. It is noted that a given ball 20 may receive electrical current from one or more power vias 44, the routing of the electrical current between the power vias 44 and the respective balls 20 is determined by the pattern of traces 33 patterned in layer 55c and/or on surface 24 of CB 22.

This particular configuration of layers 55a-55c of electronic device 11, and the configuration of respective regions 60, 64, and 68 are shown by way of example, in order to illustrate certain problems that are addressed by embodiments of the present invention and to demonstrate the application of these embodiments in enhancing the performance of such an electronic device. Embodiments of the present invention, however, are by no means limited to this specific sort of example electronic device, and the principles described herein may similarly be applied to other sorts of electronic devices that are known in the art.

Figure 3:
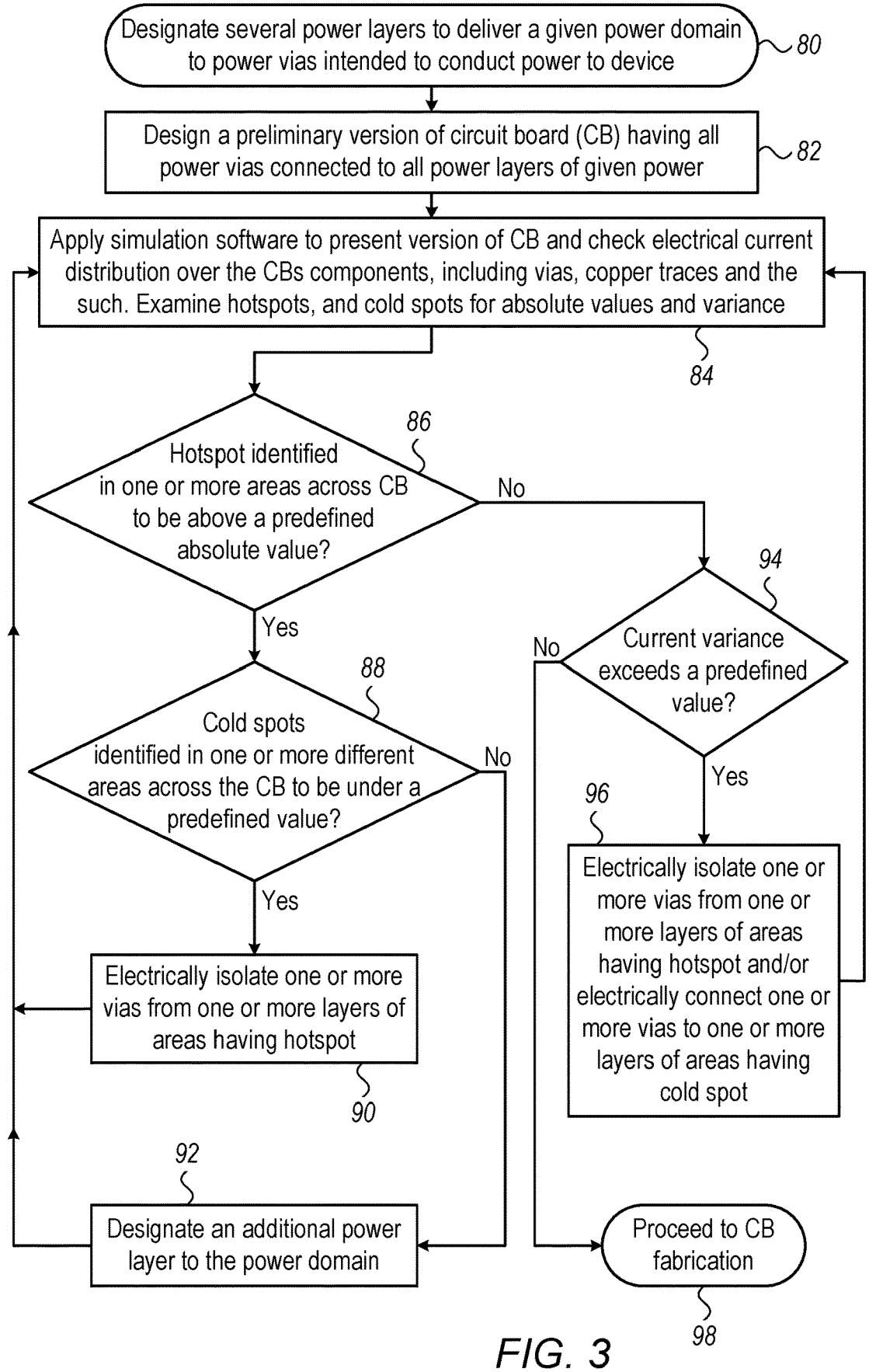
FIG. 3 is a flow chart that schematically illustrates a method for designing the substrate assembly of FIGS. 2A-2C, in accordance with an embodiment that is described herein.

FIG. 3 is a flow chart that schematically illustrates a method for controlling the level of current density across layers 55 and through vias 44 of CB 22, in accordance with an embodiment that is described herein. The method is described for vias 44 and layers 55 allocated to conduct electrical current of the power, which is flowing from PSU 30 to package 12. It is noted that the technique described in the method (of FIG. 3) below is also applicable for vias 46 and layers 55 allocated to conduct electrical current of the ground flowing from package 12 to PSU 30.

The method begins at a first design operation 80 with designating several power layers 55 (two or more) to deliver a specific power domain from PSU 30 to package 12.

At a first design operation 82, a preliminary version of CB 22 is designed and has all power vias 44 electrically connected to all layers 55. In the present example, layers 55a, 55b and 55c, and vias 44a, 44b and 44c, are all allocated for conducting a specific level of power, e.g., a specific power domain, for example about 1.2 V. Additional vias and layers of CB 22 may be allocated to conduct power levels other than about 1.2 V. It is noted that in the preliminary version, all vias 44a-44c are electrically connected to all layers 55a-55c.

At a first simulation operation 84, a processor (not shown) applies a simulation software to a model of the preliminary version of CB 22, in order to check for hotspots, cold spots, their absolute values and variance in response to electrical current surge as drawn by package 12 and flowing from PSU 30, via the model of the preliminary version of CB 22, to package 12.

At a first decision operation 86, the processor (and/or a user) checks for hotspots in the output of operation 84. In some embodiments, in case the processor identified hotspots violating a predefined absolute value (e.g., a predefined threshold) in one or more areas across the XY plain of CB 22, or through any of the vias 44, the method proceeds to a second decision operation described herein.

At a second decision operation 88, the processor (and/or a user) checks for cold spots in the output of operation 84. In some embodiments, in case the processor identified cold spots violating a predefined absolute value in one or more areas across the XY plain of CB 22, or through any of the vias 44, the method proceeds to a via isolation operation 90, in which the processor electrically isolates, e.g., disconnects one or more selected vias 44 from a selected layer 55 according to the identified area, or the identified vias. In the present example, vias 44a and 44b are being isolated from layers 55a and 55b, respectively, by applying anti-pads to the preliminary design at traversal points 66a and 66d, respectively, as depicted in detail at inset 31 of FIG. 1 above.

In embodiments, some after concluding the isolation of one or more vias in operation 90, the method loops back to operation 84 for applying the simulation and checking for hotspots and cold spots, as described above. It is noted that a loop of operations 84, 86, 88 and 90 may be carried out in multiple iterations until no more hotspots violating an absolute predefined current value are identified in the XY plain of CB 22, and more specifically, in any of layers 55a-55b and/or through any of the vias 44.

In another embodiment, at the second decision operation 88, the processor (and/or a user) checks for cold spots in the output of operation 84. In some embodiments, in case the processor does not identify cold spots violating a predefined absolute value in one or more areas across the XY plain of CB 22 or through any of the vias 44, the method proceeds to an operation 92, in which the processor designates at least one additional power layer 55 to the power domain. Following operation 92 the loops back to operation 82 where all vias 44 are connected to power layers 55 and forms an updated first design operation.

With reference back to first decision operation 86, the processor (and/or a user) checks for hotspots in the output of operation 84. In some embodiments, in case the processor does not identify hotspots violating a predefined absolute value in one or more areas across the XY plain of CB 22 or through any of the vias 44, the method proceeds to a third decision operation 94 described herein.

At third decision operation 94, the processor (and/or a user) checks for current variance exceeding a predefined value in the output of operation 84. In some embodiments, in case the processor identifies a variance violating a predefined value in one or more areas across the XY plain of CB 22, or through at least part of the vias 44, the method proceeds to a via connecting operation 96, in which one or more vias 44 (typically located within one or more areas having the cold spots) are electrically connected to one or more layers 55 (e.g., among layers 55a-55b) of CB 22. Subsequently, the method loops back to operation 84 for reapplying the simulation to the present version of CB 22 and checking for hotspots and cold spots, as described in detail in operation 84 above. Alternatively, in case at operation 94 the processor does not identify a variance violating a predefined value in one or more areas across the XY plain of CB 22 or through at least part of the vias 44, the method proceeds to a CB fabrication operation 98 for fabricating CB 22. Note that the fabrication of CB 22 and electronic device 11 are depicted in detail in a flow chart of FIG. 4 below.

Figure 4:
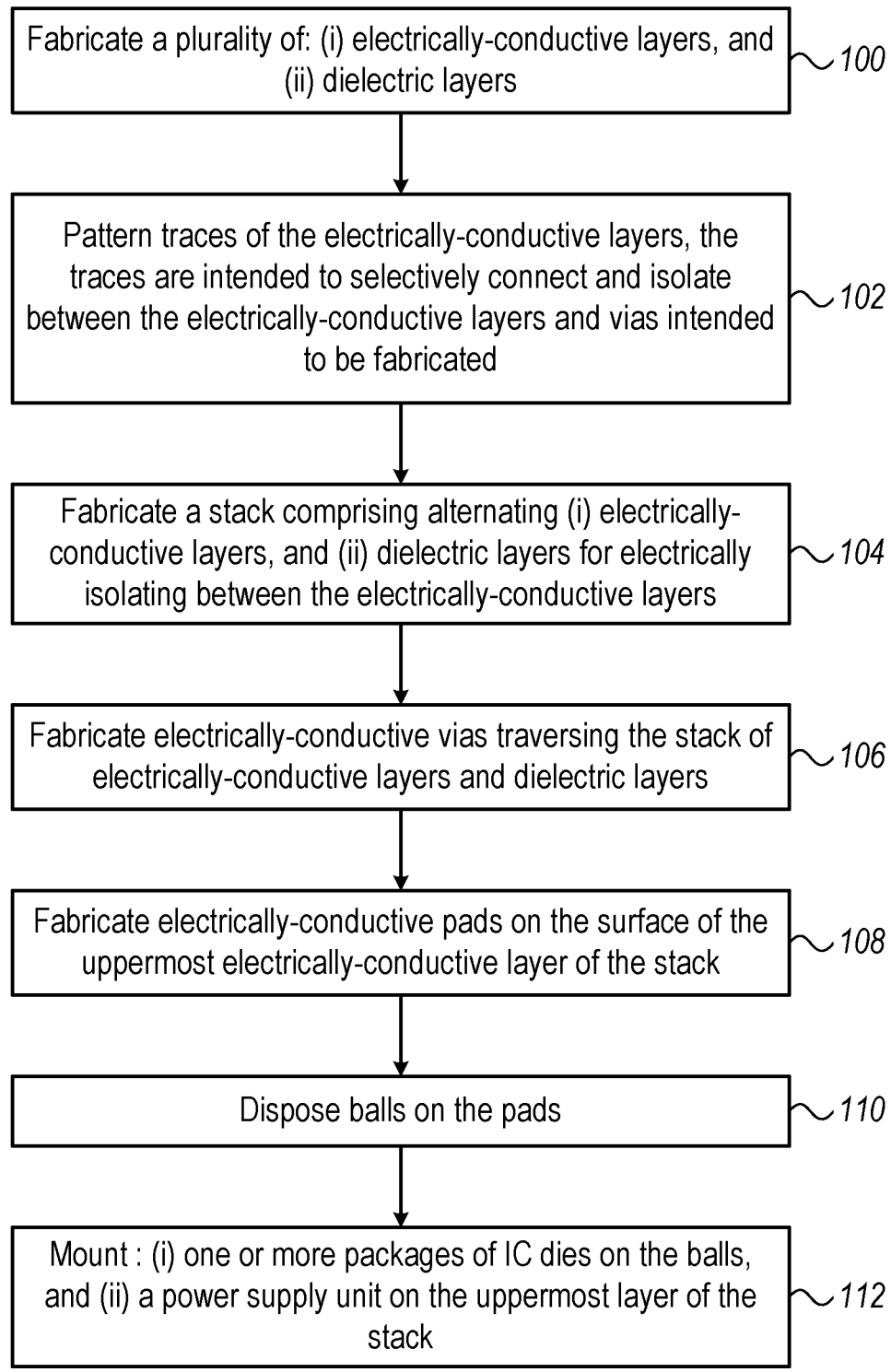
FIG. 4 is a flow chart that schematically illustrates a method for fabricating the electronic device of FIG. 1, in accordance with an embodiment that is described herein.

FIG. 4 is a flow chart that schematically illustrates a method for fabricating CB 22 of electronic device 11, in accordance with an embodiment that is described herein.

The method begins at a layer fabrication operation 100 with fabricating layers 55 and dielectric 58 of CB 22, which are described in detail in FIG. 1 above. It is noted that layers 55 and 58 are fabricated and stacked concurrently, for example, layer 55a is fabricated including patterning of traces 33 (as will be described in detail below), and subsequently, layer 58 is formed over layer 55a, as shown in the sectional views of FIG. 1 above.

At a trace patterning operation 102, traces 33 are being patterned during the fabrication of each respective layer 55. Traces 33 are intended to electrically couple and electrically connect between vias 44 and 46 and respective layers 55, as described in detail in FIG. 1 above. Moreover, the pattern of traces 33 determines, for example, regions 60, 64 and 68 depicted in FIGS. 2A, 2B and 2C, above.

At a stacking operation 104, CB 22 is formed by alternately stacking layers 55 and 58 along the Z-axis of electronic device 11, as shown in FIG. 1 above. It is noted that the fabrication of layers 55 and 58 is carried out concurrently with the stacking of layers 55 and 58, as described in operation 100 above.

At a via formation operation 106, vias 44 and vias 46 are fabricated along the Z-axis of CB 22, such that vias 44 and 46 traverse at least one of layers 55 and 58, as shown in FIG. 1 above. It is noted that vias 44 and 46 are formed by drilling holes traversing the one of more layers 55 and 58, and subsequently, filling the holes with copper, as described in detail in FIG. 1 above. Moreover, the trace patterning of operation 102 determines the electrical connectivity and isolation between (i) each via 44 and 46, and (ii) each layer 55, as described in detail in FIGS. 1-2C above.

At a pad formation operation 108, electrically conductive pads 34 are formed on surface 24, which is the outer surface of the uppermost layer 55 in the stack of CB 22. In the example of FIG. 1 above, surface 24 is the outer surface of layer 55c. It is noted that pads 34 are electrically coupled with one or more (i) selected vias 44 of the power channels, or (ii) selected vias 46 of the ground channels, as depicted in detail in FIG. 1 above.

At a terminal disposing operation 110, balls 20 or any other suitable type of terminals (e.g., pins or springs) are disposed over the outer surface of pads 34, as depicted in inset 21 of FIG. 1 above.

At a mounting operation 112 that concludes the method, (i) one or more packages 12 of one or more IC dies 16 are mounted on balls 20, and (ii) PSU 30 is mounted on surface 24 of CB 22, as described in detail FIG. 1 above.

The method of FIG. 3 is provided by way of example and is simplified for the sake of presentation clarity, and typically comprises additional processing operations, of the fabrication of CB 22 and the assembling between CB 22 and (i) package 12, and (ii) PSU 30. It is noted that the mounting and assembly of package 12 and PSU 30 on surface 24 of CB 33, may be carried out using any suitable sort of assembly and packaging processes.

It is noted that the embodiments described above are cited by way of example, and that the present invention is not limited to what has been particularly shown and described hereinabove. Rather, the scope of the present invention includes both combinations and sub-combinations of the features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electrical circuit board assembly, comprising:
a surface, having a plurality of terminals disposed thereon for transferring a power signal to an electronic device;
at least first and second layers separated by at least one dielectric layer, the first and second layers being configured to (a) be connected to the power signal, and (b) electrically conduct at least a portion of the power signal; and
multiple vias that (i) mechanically traverse the first and second layers at respective traversal points, and (ii) are electrically connected to the terminals on the surface, the multiple vias comprising:
first vias that, at the respective traversal points, are electrically connected to the first layer and electrically isolated from the second layer; and
second vias that, at the respective traversal points, are electrically connected to the second layer and electrically isolated from the first layer, wherein the first vias are arranged in a first region, and the second vias are arranged in a second region, wherein the multiple vias further comprise third vias that, at the respective traversal points, are electrically connected to both the first layer and the second layer, and wherein a first current density difference among the first vias, the second vias and the third vias is less than a first predetermined threshold.

2. The electrical circuit board assembly according to claim 1, wherein the vias are portioned into the first vias and the second vias to maintain a second differential in electrical-current density of the power signal between the first vias and the second vias at a level less than a second predetermined threshold.

3. The electrical circuit board assembly according to claim 1, wherein a partitioning of the vias into the first vias and the second vias reduces, below a third predetermined threshold, a third difference in an electrical-current density of the power signal between the first layer and the second layer.

4. The electrical circuit board assembly according to claim 1, wherein the vias are portioned into the first vias and the second vias to maintain a fourth differential in electrical-current density of the power signal among the multiple terminals at a level less than a fourth predetermined threshold.

5. The electrical circuit board assembly according to claim 1, wherein the vias are portioned into the first vias and the second vias to maintain a fifth differential in electrical-current density of the power signal flowing within a predefined area of at least one of the first layer and the second layer, at a level less than a fifth predetermined threshold.

6. The electrical circuit board assembly according to claim 1, wherein the first and second regions do not overlap with one another.

7. The electrical circuit board assembly according to claim 1, wherein the first and second regions at least partially overlap with one another.

8. The electrical circuit board assembly according to claim 1, wherein the first and second regions being arranged in concentric shapes.

9. The electrical circuit board assembly according to claim 1, wherein one or more of the third vias are arranged in at least one of the first region and the second region.

10. The electrical circuit board assembly according to claim 1, wherein at least one of the: (i) first vias, (ii) second vias, and (iii) third vias is arranged outside of both the first region and the second region.

11. The electrical circuit board assembly according to claim 1, further comprising a power supply unit (PSU) configured to generate the power signal.

12. The electrical circuit board assembly according to claim 11, wherein the power signal comprises an electrical current of power flowing from the PSU to the electronic device.

13. The electrical circuit board assembly according to claim 11, wherein the power signal comprises an electrical current of ground flowing from the electronic device to the PSU.

14. A method for fabricating an electrical circuit board assembly, the method comprising:
fabricating at least first and second circuit board layers separated by at least one dielectric layer, the first and second circuit board layers being connected to a power signal for electrically conducting at least a portion of the power signal; and
forming multiple vias in the circuit board layers (i) that mechanically traverse the first and second layers at respective traversal points, and (ii) are electrically connected to an outer surface of the substrate assembly that is facing an electronic device, wherein forming the multiple vias comprising:
forming first vias that, at the respective traversal points, are electrically connected to the first layer and electrically isolated from the second layer; and
forming second vias that, at the respective traversal points, are electrically connected to the second layer and electrically isolated from the first layer, wherein forming the multiple vias comprises arranging the first vias in a first region and arranging the second vias in a second region, and wherein forming the multiple vias further comprises forming third vias that, at the respective traversal points, are electrically connected to both the first layer and the second layer, wherein a first current density difference among the first vias, the second vias and the third vias is less than a predetermined threshold.

15. The method according to claim 14, wherein forming the third vias comprises arranging one or more of the third vias in at least one of the first region and the second region.

16. The method according to claim 14, wherein forming the first vias, second vias, and third vias, comprises arranging at least one of the: (i) first vias, (ii) second vias, and (iii) third vias, outside of both the first region and the second region.

17. The method according to claim 14, wherein arranging the first vias in the first region and arranging the second vias in the second region comprises arranging the first and second regions not overlapping with one another.

18. The method according to claim 14, wherein arranging the first vias in the first region and arranging the second vias in the second region comprises arranging the first and second regions to at least partially overlap with one another.

19. The method according to claim 14, wherein arranging the first vias in the first region and arranging the second vias in the second region comprises arranging the first and second regions in concentric shapes.

\* \* \* \* \*